(12) United States Patent
Funahashi et al.

(10) Patent No.: US 10,561,032 B2
(45) Date of Patent: Feb. 11, 2020

(54) PRINTING CIRCUIT BOARD ACCOMMODATION CASING HAVING ENGAGEMENT PROTRUSION WITH CRUSHING MARGIN

(71) Applicant: AISIN SEIKI KABUSHIKI KAISHA, Kariya-shi, Aichi-ken (JP)

(72) Inventors: Akitsugu Funahashi, Anjo (JP); Takeshi Tsuriki, Aichi-ken (JP); Takahiro Suga, Kariya (JP)

(73) Assignee: AISIN SEIKI KABUSHIKI KAISHA, Kariya-Shi, Aichi-Ken (JP)

( * ) Notice: Subject to any disclaimer, the term of this patent is extended or adjusted under 35 U.S.C. 154(b) by 0 days.

(21) Appl. No.: 15/873,500

(22) Filed: Jan. 17, 2018

(65) Prior Publication Data

US 2018/0206348 A1 Jul. 19, 2018

(30) Foreign Application Priority Data

Jan. 19, 2017 (JP) .................. 2017-007864

(51) Int. Cl.
*H05K 5/00* (2006.01)
*H05K 5/02* (2006.01)
*H05K 5/04* (2006.01)
*H05K 7/14* (2006.01)

(52) U.S. Cl.
CPC ......... *H05K 5/0047* (2013.01); *H05K 5/0226* (2013.01); *H05K 5/04* (2013.01); *H05K 7/1405* (2013.01)

(58) Field of Classification Search
CPC ...... H05K 5/0047; H05K 5/0226; H05K 5/04; H05K 7/1405; H05K 7/1402; H05K 7/1432; H05K 7/1427; H05K 7/1422
See application file for complete search history.

(56) References Cited

U.S. PATENT DOCUMENTS

| 7,008,240 B1* | 3/2006 | Wang .................. H05K 5/0217 361/737 |
| 7,417,868 B2* | 8/2008 | Morisada ............. H05K 7/1405 361/741 |
| 9,510,474 B2* | 11/2016 | Chou ..................... H05K 7/142 |
| 9,723,740 B2* | 8/2017 | Yang ................... H05K 7/1427 |
| 10,010,006 B2* | 6/2018 | Tanaka ................ H05K 5/0069 |
| 2008/0245544 A1* | 10/2008 | Warren .................... H02G 3/10 174/50 |

(Continued)

FOREIGN PATENT DOCUMENTS

JP H07-31596 Y2 7/1995
JP 4379288 B2 12/2009

*Primary Examiner* — Binh B Tran
*Assistant Examiner* — Douglas R Burtner
(74) *Attorney, Agent, or Firm* — Buchanan Ingersoll & Rooney PC

(57) ABSTRACT

A printed circuit board accommodation casing includes: a support surface that abuts on a first planar portion of a printed circuit board; a side wall portion located outside in a planar direction of the printed circuit board, the first planar portion of which is abutted by the support surface; and an engagement protrusion formed on the side wall portion, in which a crushing margin, which is crushed against the first planar portion of the printed circuit board, is set on the engagement protrusion at a location where the support surface does not abut on the first planar portion of the printed circuit board.

13 Claims, 10 Drawing Sheets

(56) References Cited

U.S. PATENT DOCUMENTS

| | | | | |
|---|---|---|---|---|
| 2010/0254104 | A1* | 10/2010 | Blake, III | H05K 5/066 |
| | | | | 361/757 |
| 2010/0259901 | A1* | 10/2010 | Sanroma | H05K 5/061 |
| | | | | 361/720 |
| 2010/0271791 | A1* | 10/2010 | Loibl | B60R 16/0239 |
| | | | | 361/760 |
| 2012/0262892 | A1* | 10/2012 | Kanou | H05K 5/0013 |
| | | | | 361/752 |
| 2013/0258617 | A1* | 10/2013 | Inoue | H05K 7/02 |
| | | | | 361/752 |
| 2014/0321081 | A1* | 10/2014 | Sun | H05K 7/1417 |
| | | | | 361/753 |
| 2015/0327354 | A1* | 11/2015 | Umeno | H05K 7/205 |
| | | | | 361/720 |
| 2015/0351262 | A1* | 12/2015 | Jorgensen | H05K 5/0039 |
| | | | | 312/223.1 |
| 2016/0031398 | A1* | 2/2016 | Azuma | B60R 21/01 |
| | | | | 361/752 |
| 2016/0113137 | A1* | 4/2016 | Nuriya | H01R 13/5202 |
| | | | | 361/728 |
| 2016/0143158 | A1* | 5/2016 | Wakana | H05K 5/0039 |
| | | | | 361/752 |
| 2016/0295729 | A1* | 10/2016 | Hanada | H05K 5/0052 |
| 2017/0105295 | A1* | 4/2017 | Suzuki | G06F 1/1626 |
| 2017/0112011 | A1* | 4/2017 | Nuriya | H05K 1/181 |
| 2017/0164496 | A1* | 6/2017 | Imaizumi | H01R 12/58 |
| 2018/0014418 | A1* | 1/2018 | Kang | H05K 5/0047 |
| 2018/0054901 | A1* | 2/2018 | Van Roon | H05K 5/003 |
| 2018/0054912 | A1* | 2/2018 | Hannig | H05K 7/1417 |
| 2018/0098431 | A1* | 4/2018 | Park | H05K 1/115 |
| 2019/0019618 | A1* | 1/2019 | Fukui | H01F 27/2804 |
| 2019/0098777 | A1* | 3/2019 | Nakatsu | H05K 5/0026 |

* cited by examiner

PRINTING CIRCUIT BOARD ACCOMMODATION CASING HAVING ENGAGEMENT PROTRUSION WITH CRUSHING MARGIN

CROSS REFERENCE TO RELATED APPLICATIONS

This application is based on and claims priority under 35 U.S.C. § 119 to Japanese Patent Application 2017-007864, filed on Jan. 19, 2017, the entire contents of which are incorporated herein by reference.

TECHNICAL FIELD

This disclosure relates to a printed circuit board accommodation casing.

BACKGROUND DISCUSSION

In the related art, as described in, for example, JP 07-031596 U (Reference 1), a printed circuit board accommodation casing, which accommodates a printed circuit board mounted with a control circuit, may include a pair of guide portions provided on the inner wall surface of the accommodation casing with the printed circuit board accommodated in the accommodation casing being sandwiched between the guide portions in the thickness direction. That is, such an accommodation casing holds the printed circuit board in such a manner that side end portions of the printed circuit board are inserted between both guide portions. In the accommodation casing in this example in the related art, an engagement protrusion is formed to protrude from one side to the other side of both projecting portions. In addition, a crushing margin that is crushed by an insertion pressure of the printed circuit board inserted between both projecting portions in the extending direction is set at the distal end of the engagement protrusion so that the printed circuit board is more reliably held with a clamping pressure.

However, in the configuration of the above described technology in the related art, there is a possibility that a gap of tolerance may be formed between the side end portions of the printed circuit board and the inner wall surface of the accommodation casing on which both guide portions are provided. Therefore, for example, under a vibrating environment such as a control device for a vehicle, there is a problem in that a rattling of the printed circuit board occurs due to the gap in the planar direction. In addition, when a clamping pressure in the thickness direction is strengthened so as to suppress such a rattling of the printed circuit board, there is a risk that the printed circuit board may be deflected. Thus, in this regard, there is still room for improvement.

Thus, a need exists for a printed circuit board accommodation casing which is not susceptible to the drawback mentioned above.

SUMMARY

It is preferable that a printed circuit board accommodation casing according to an aspect of this disclosure includes: a support surface that abuts on a first planar portion of a printed circuit board; a side wall portion located outside in a planar direction of the printed circuit board the first planar portion of which is abutted by the support surface; and an engagement protrusion formed on the side wall portion, in which a crushing margin, which is crushed against the first planar portion of the printed circuit board, is set on the engagement protrusion at a location where the support surface does not abut on the first planar portion of the printed circuit board.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

Hereinafter, descriptions will be made on an embodiment in which a printed circuit board accommodation casing is implemented in a control device of a steering apparatus with reference to drawings.

Figure 1:
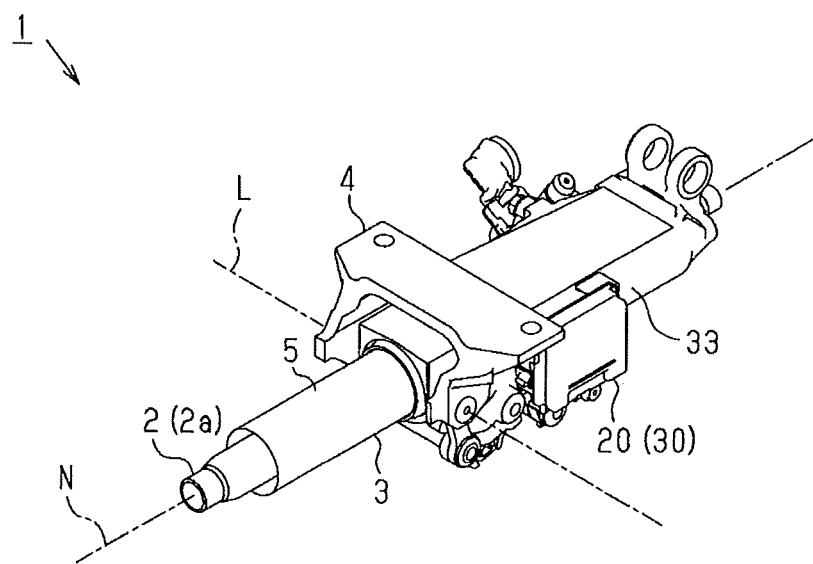
FIG. 1 is a perspective view of a steering apparatus.
Figure 2:
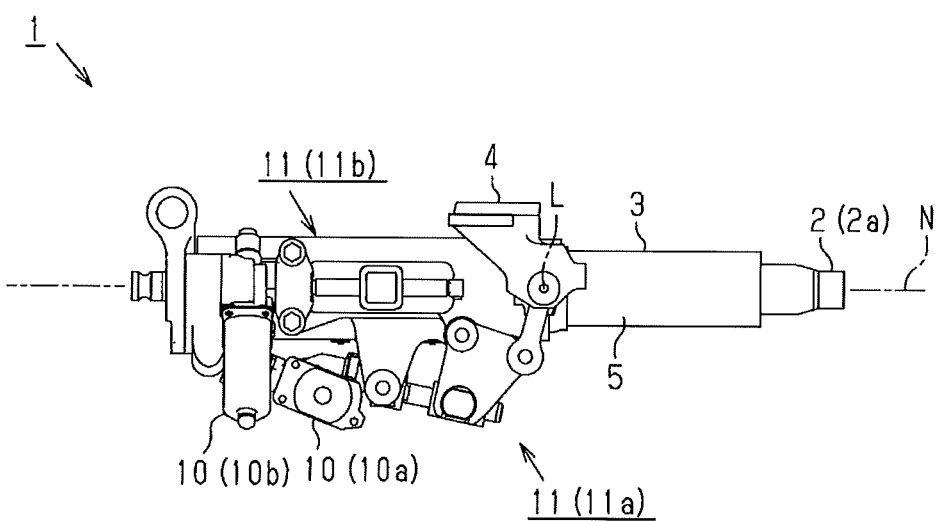
FIG. 2 is a side view of the steering apparatus.

As illustrated in FIGS. 1 and 2, a steering apparatus 1 of a vehicle includes: a steering shaft 2 that has a steering wheel (not illustrated) mounted at a distal end 2a thereof; a steering column 3 that rotatably supports the steering shaft 2; and a fixing bracket 4 that fixes the steering column 3 to a vehicle body (not illustrated).

The steering column 3 of the embodiment has a configuration known in the related art, in which the steering shaft (column shaft) 2 is accommodated within a support tube 5 formed in a substantially cylindrical shape. The fixing bracket 4 has a support axis L perpendicular to the axis N of the steering shaft 2 and extending in the horizontal direction. Then, the steering apparatus 1 of the embodiment includes a tilt actuator 11a which tilts the steering column 3 around the support axis L using a motor 10 (10a) as a driving source, and then tilts the steering shaft 2 supported by the steering column 3.

The steering shaft 2 of the embodiment has an extensible and rotation-transmissible configuration in which two shaft-shaped members are spline-fitted to each other. Further, in the steering column 3 of the embodiment, a pair of support tubes 5 (an outer tube and an inner tube) are concentrically disposed so as to rotatably support the respective shaft-shaped members. In addition, the steering apparatus 1 of the embodiment includes a telescopic actuator 11b which relatively moves the two support tubes 5 in the axial direction using the motor 10 (10b) as a driving source, thereby extending and contracting the steering shaft 2.

Further, the steering apparatus 1 of the embodiment includes a control device 20 that controls the operations of the actuators 11 (11a and 11b). Specifically, the control device 20 controls the operation of each of the actuators 11 by supplying a drive power to each of the motors 10 (10a and 10b) of the actuators 11. In the steering apparatus 1 of the embodiment, a DC motor with brushes is employed in each of the motors 10 (10a and 10b) of the actuators 11. In addition, the control device 20 of the embodiment is configured to control the operation of the tilt actuator 11a, thereby changing the vertical position of the steering wheel mounted at the distal end 2a of the steering shaft 2 (tilt control), and to control the operation of the telescopic actuator 11b, thereby changing the front-rear position of the steering wheel (telescopic control).

Specifically, as illustrated in FIGS. 3 to 6, the control device 20 of the embodiment includes a substantially rectangular box-shaped flat accommodation casing 30 and a printed circuit board 31 accommodated in the accommodation casing 30. That is, a control circuit (not illustrated) configured to control the operations of the actuators 11 (11a and 11b) provided in the steering apparatus 1 is mounted on the printed circuit board 31. The accommodation casing 30 of the embodiment is made of a resin. In addition, as illustrated in FIG. 1, the control device 20 of the embodiment is assembled to the steering apparatus 1 such that the accommodation casing 30 is fitted to a housing 33 of the steering column 3 made of a metal.

As illustrated in FIGS. 5 to 9, the accommodation casing 30 of the embodiment includes first and second casing members 41 and 42 which are assembled to each other so as to form an accommodation chamber 35 of the printed circuit board 31. Specifically, in the accommodation casing 30 of the embodiment, the first casing member 41 includes a bottom plate portion 43 that forms a substantially rectangular bottom surface 41s, and a side wall portion 44 which is erected on the peripheral portion of the bottom plate portion 43 such that the side wall portion 44 surrounds four sides of the bottom surface 41s. The second casing member 42 includes a top plate portion 45 having a substantially rectangular plate-like outer shape, and a side wall portion 46 surrounding the peripheral portion of the top plate portion 45. Further, the box-form of the second casing member 42 formed by the top plate portion 45 and the side wall portion 46 has a slightly larger external dimension than the box-form of the first casing member 41 formed by the bottom plate portion 43 and the side wall portion 44. In addition, in the accommodation casing 30 of the embodiment, the first and second casing members 41 and 42 are assembled such that the box shapes thereof are fitted to each other.

More specifically, as illustrated in FIG. 5 and FIGS. 8 to 10, the accommodation casing 30 of the embodiment includes a hinge portion 48 that connects the first and second casing members 41 and 42 to each other with bendable-flexibility. In the accommodation casing 30 of the embodiment, the hinge portion 48 is provided to connect a side end portion 41a of the first casing member 41 and a side end portion 42a of the second casing member 42 to each other, which constitute a first side end portion 30a in the accommodation casing 30 (see FIG. 4, the right side end portion in the same drawing). Specifically, the accommodation casing 30 of the embodiment is configured such that the first and second casing members 41 and 42 are integrally resin-molded. In addition, here, the hinge portion 48 of the embodiment has a thin-plate-like outer shape and is formed integrally with the first and second casing members 41 and 42.

Figure 6:
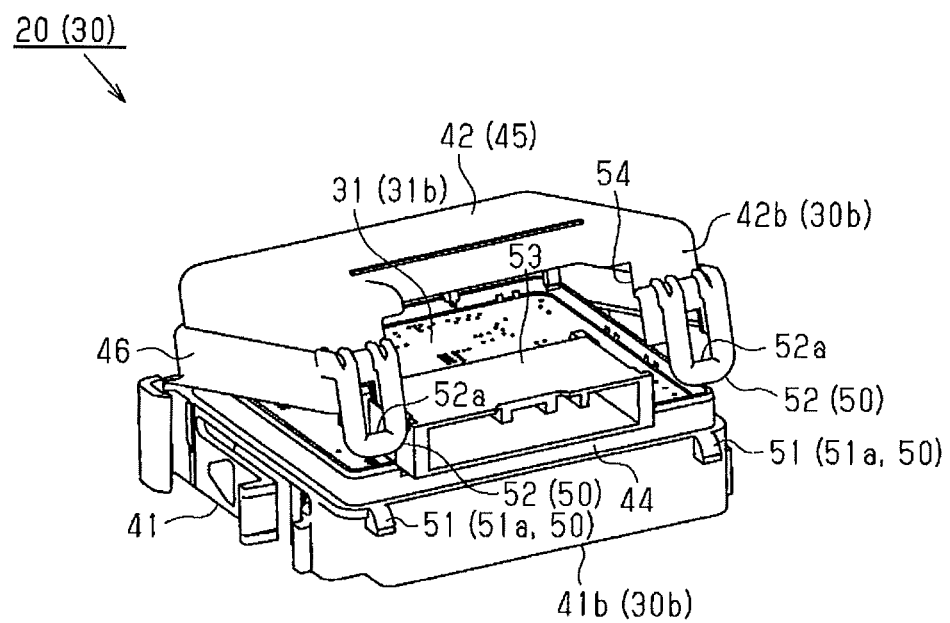
FIG. 6 is a perspective view of a printed circuit board and an accommodation casing constituting the control device.

That is, in the accommodation casing 30 of the embodiment, the hinge portion 48 is bent along the side end portions 41a and 42a of the first and second casing members 41 and 42 so that the first and second casing members 41 and 42 are relatively rotated about the hinge portion 48 as a fulcrum (see FIG. 6). Accordingly, the box-forms of the first and second casing members 41 and 42 are fitted to each other such that the printed circuit board 31 is accommodated within the accommodation chamber 35 formed between the first and second casing members 41 and 42.

As illustrated in FIGS. 3 to 6, the accommodation casing 30 of the embodiment includes snap fits 50 that fix the first and second casing members 41 and 42 on a second side end portion 30b opposite to the first side end portion 30a on which the hinge portion 48 is provided.

Figure 4:
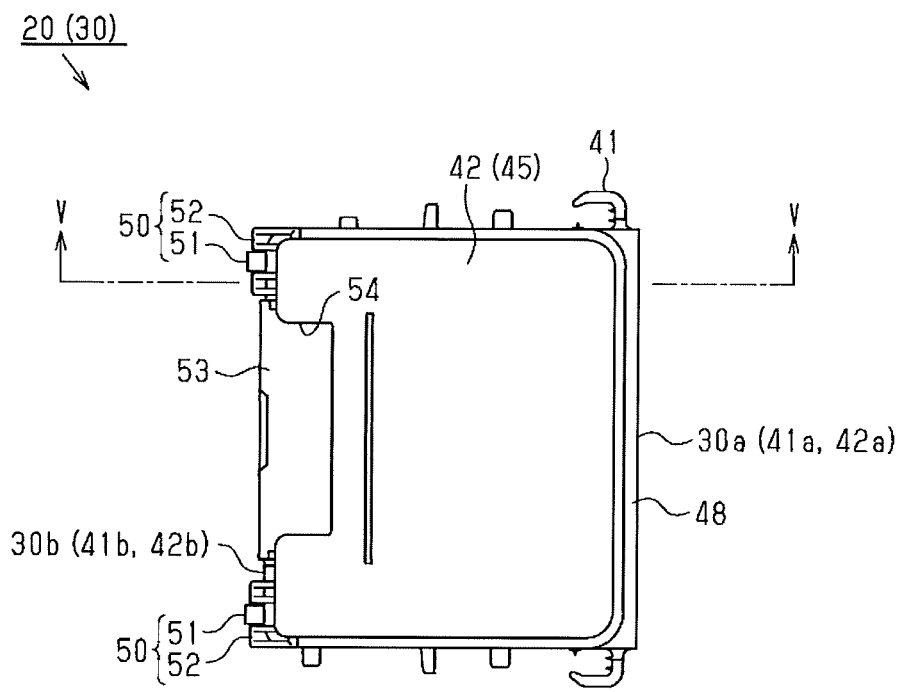
FIG. 4 is a plan view of the control device.

Specifically, as illustrated in FIGS. 7 to 10, engagement protrusions 51 are formed on a side end portion 41b of the first casing member 41 which constitutes the second side end portion 30b of the accommodation casing 30 (see FIG. 4, the left side end portion in the same drawing). In the accommodation casing 30 of the embodiment, the engagement protrusions 51 are formed in a substantially wedged shape with a slope 51a in a direction in which the box-form of the first casing member 41 is opened (upwards in FIG. 10). Similarly, engagement pieces 52 each of which has a hole portion 52a to be fitted to the engagement protrusion 51 are provided on a side end portion 42b of the second casing member 42 which constitutes the second side end portion 30b of the accommodation casing 30.

Figure 3:
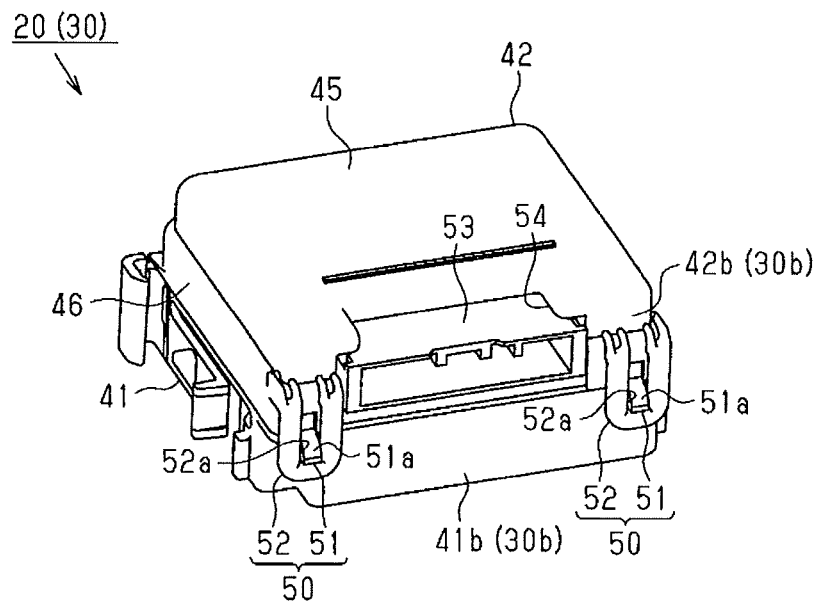
FIG. 3 is a perspective view of a control device provided in the steering apparatus.

As illustrated in FIGS. 3, 4, and 6, in the accommodation casing 30 of the embodiment, a slit 54 is formed in such a manner that the slit 54 cuts out a part of the side end portion 42b of the second casing member 42. The slit 54 allows a connector portion 53 formed on the printed circuit board 31 to be drawn out to the outside of the accommodation casing 30. In addition, on the second side end portion 30b of the accommodation casing 30, the engagement protrusions 51 and the engagement pieces 52, which constitute the snap fits 50, are provided at both sides of the slit 54 in the width direction (in the up-down direction in FIG. 4).

That is, in the accommodation casing 30 of the embodiment, the second casing member 42 serving as a cover member rotates about the hinge portion 48 as a fulcrum such that the engagement pieces 52 provided at the second casing member 42 side abut on the slopes 51a of the engagement protrusions 51 formed at the first casing member 41 side. Further, the engagement pieces 52 slide on the slopes 51a of the engagement protrusions 51 while being elastically deformed. Accordingly, in the accommodation casing 30 of the embodiment, the hole portions 52a of the engagement pieces 52 are fitted to the engagement protrusions 51, thereby non-detachably fixing the first and second casing members 41 and 42.

(Printed Circuit Board Fixing Structure)

Next, the fixing structure of the printed circuit board 31 in the accommodation casing 30 of the embodiment will be described.

Figure 10:
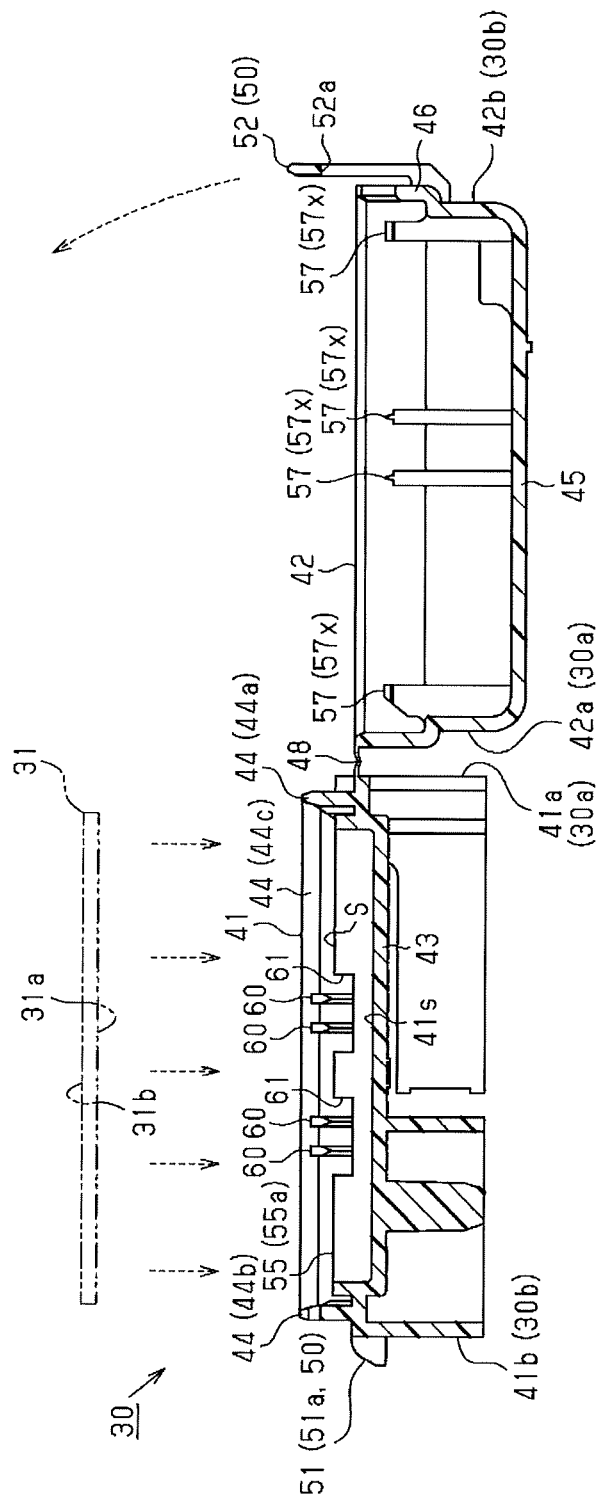
FIG. 10 is a sectional view of the first casing member and the second casing member (a sectional view taken along X-X in FIG. 9)

As illustrated in FIG. 10, the printed circuit board 31 of the embodiment is assembled to the first casing member 41, which constitutes the accommodation casing 30, from the side of the back surface 31a, which becomes a first planar portion. Specifically, the printed circuit board 31 is inserted into the box-form of the first casing member 41, that is, the inside of the side wall portion 44 surrounding the four sides of the bottom surface 41s while the back surface 31a is kept facing the bottom surface 41s of the first casing member 41. Accordingly, as illustrated in FIG. 5, the first casing member 41 of the embodiment has a support surface S that abuts on the back surface 31a of the printed circuit board 31.

Figure 7:
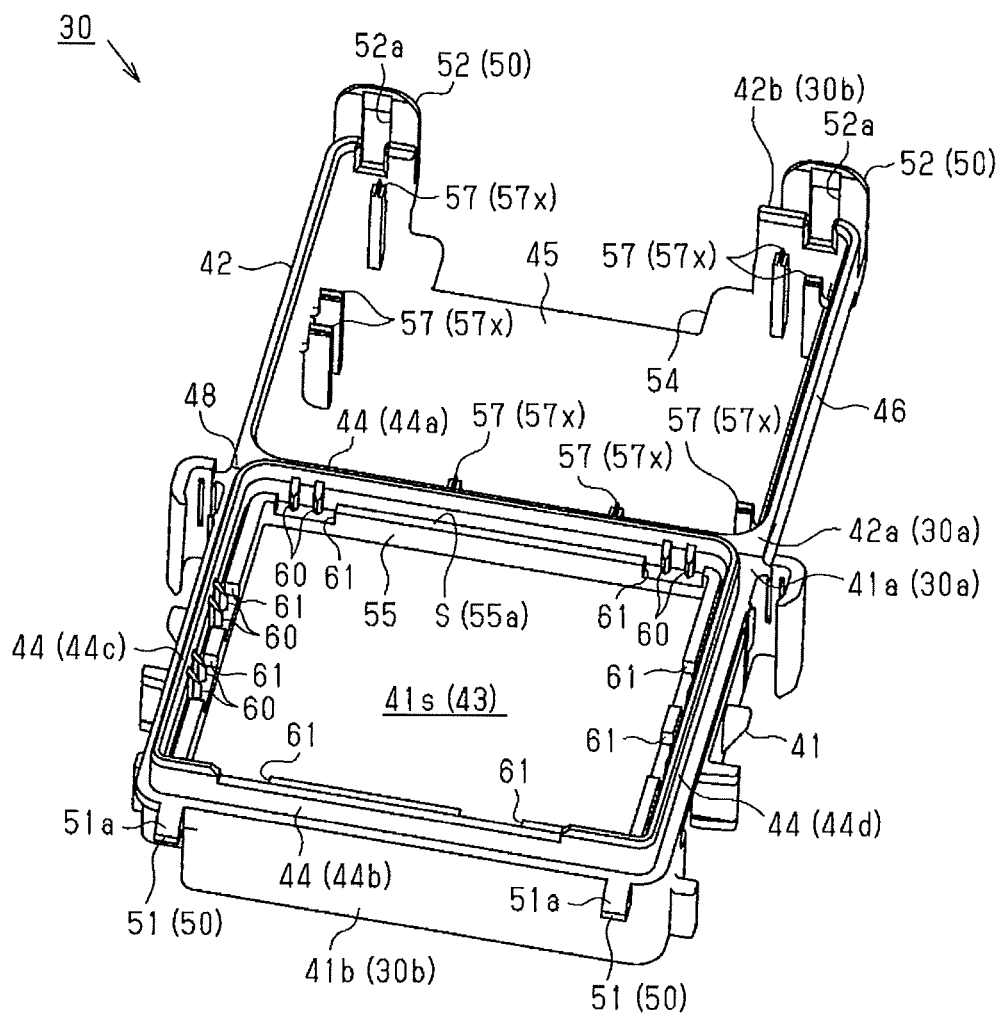
FIG. 7 is a perspective view of a first casing member and a second casing member which constitute the accommodation casing.
Figure 8:
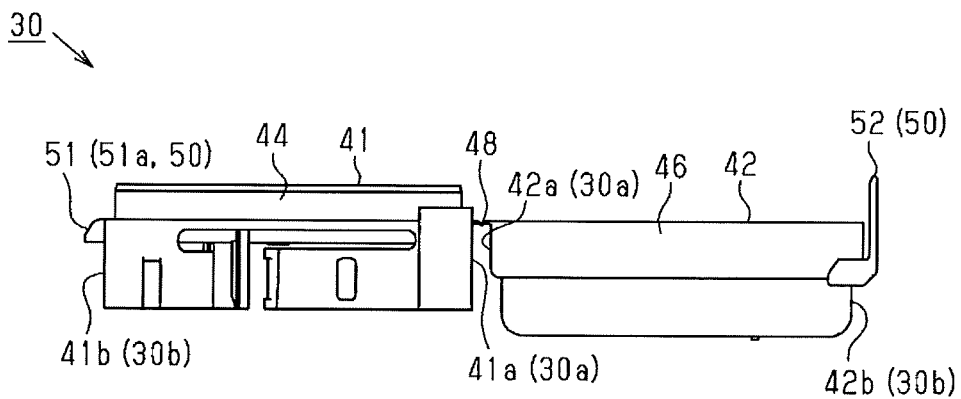
FIG. 8 is a side view of the first casing member and the second casing member.
Figure 9:
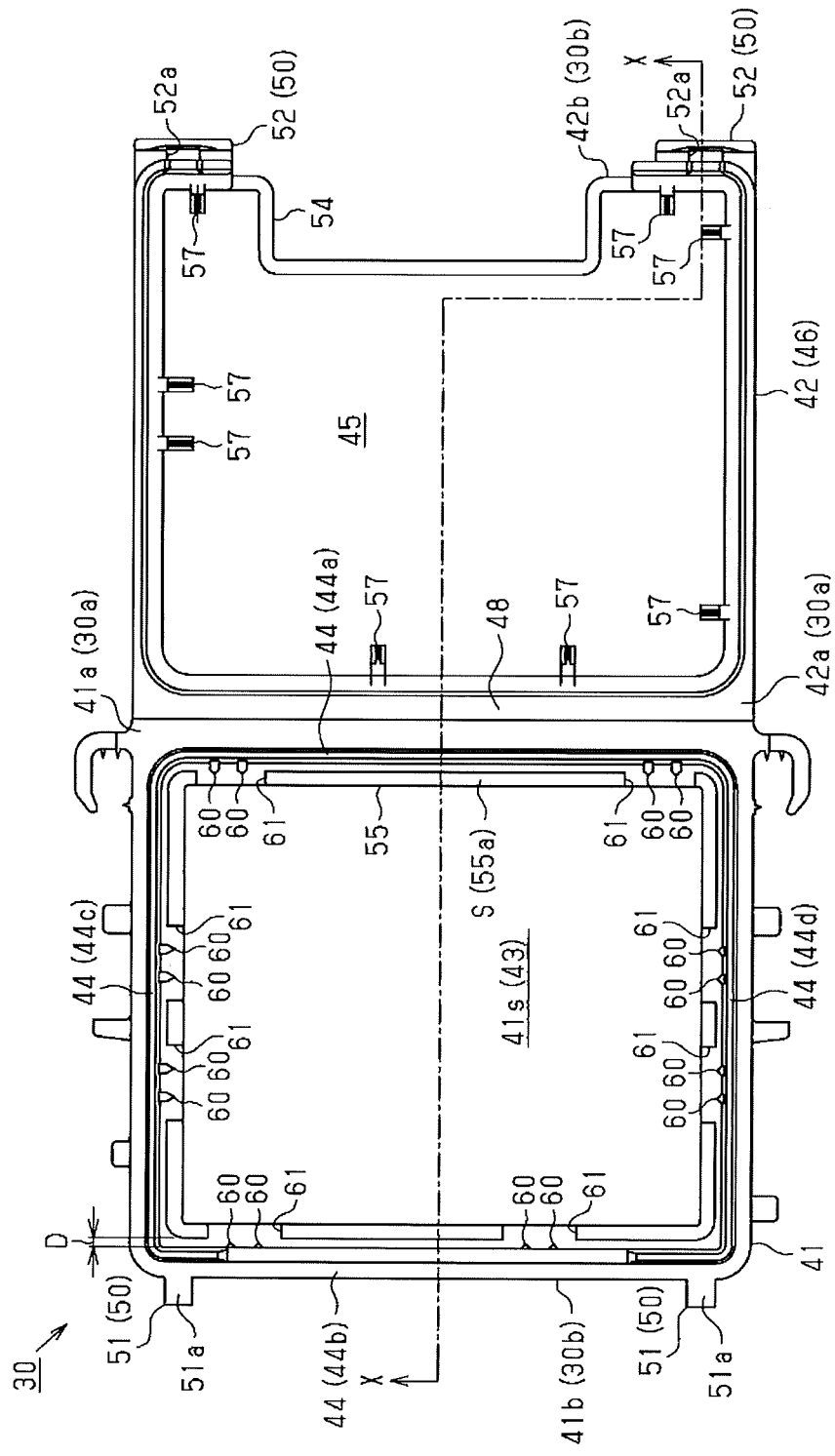
FIG. 9 is a plan view of the first casing member and the second casing member.

Specifically, as illustrated in FIGS. 7 and 9, the first casing member 41 of the embodiment includes an annular protrusion 55 erected on the inner side of the side wall portion 44, which surrounds the bottom surface 41s. In the first casing member 41 of the embodiment, the annular protrusion 55 has a substantially rectangular annular outer shape extending, along the side wall portion 44, over substantially the entire circumference of the bottom surface 41s formed in a substantially rectangular shape. In the embodiment, a gap D is formed between the annular protrusion 55 and the side wall portion 44. In addition, as illustrated in FIG. 5, the first casing member 41 of the embodiment is configured such that the annular protrusion 55 functions as a support protrusion that has a top portion 55a on which the support surface S for the printed circuit board 31 is formed.

Figure 5:
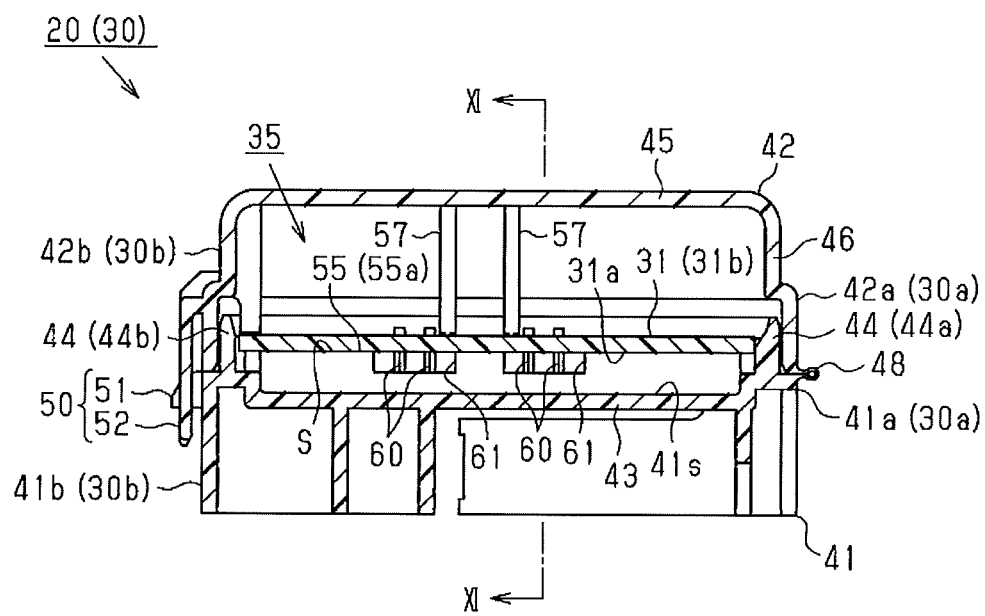
FIG. 5 is a sectional view of the control device (a sectional view taken along V-V in FIG. 4)
Figure 11:
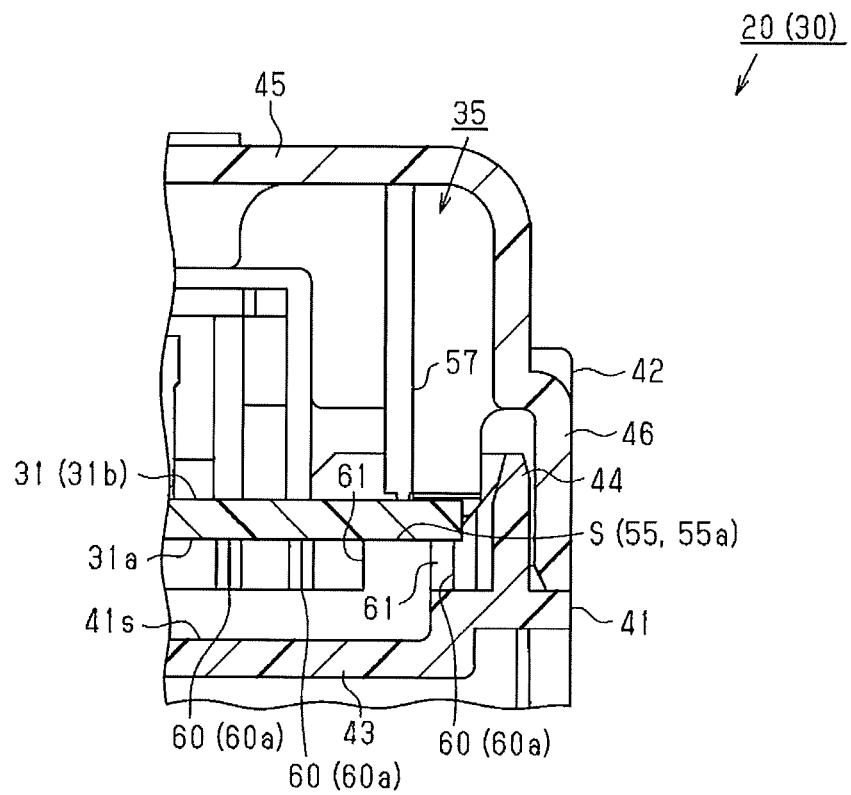
FIG. 11 is a sectional view of the control device (a sectional view taken along XI-XI in FIG. 5)

As illustrated in FIGS. 5 and 11, the second casing member 42 of the embodiment includes plural pressing portions 57 that abut on a front surface 31b of the printed circuit board 31 held by the first casing member 41 in a state where the second casing member 42 is assembled to the first casing member 41. Specifically, as illustrated in FIGS. 7 and 10, each of the pressing portions 57 has a substantially rectangular shaft-like outer shape extending from the top plate portion 45 in the direction in which the box-form of the second casing member 42 is opened (the upper side in FIG. 10). That is, in the accommodation casing 30 of the embodiment, the second casing member 42 serving as a cover member rotates about the hinge portion 48 as a fulcrum such that the pressing portions 57 abut on the front surface 31b of the printed circuit board 31 which becomes a second planar portion. In addition, the pressing portions 57 push the printed circuit board 31 against the support surface S at the first casing member 41 side so as to hold the printed circuit board 31 such that the printed circuit board 31 is sandwiched between the first casing member 41 and the second casing member 42.

Figure 12:
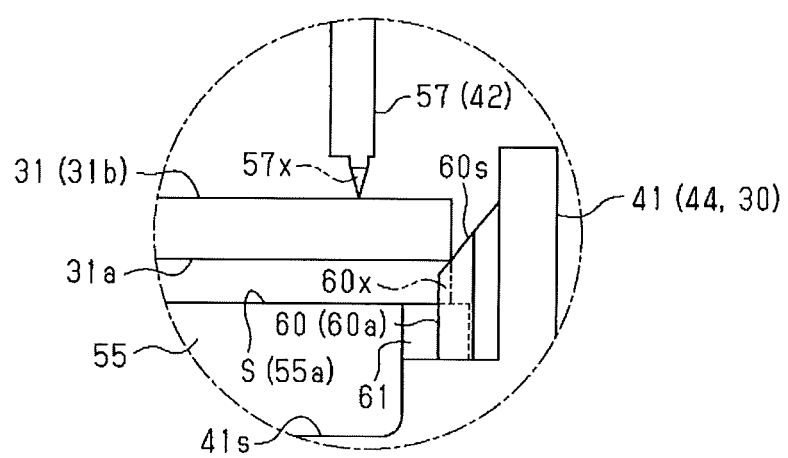
FIG. 12 is an explanatory view of the printed circuit board sandwiched between the first casing member and the second casing member, and a crushing margin set on an engagement protrusion.

More specifically, as illustrated in FIGS. 7, 9 and 12, the accommodation casing 30 of the embodiment includes plural engagement protrusions 60 formed on the side wall portion 44 of the first casing member 41. In addition, as illustrated in FIG. 12, in each of the engagement protrusions 60, a crushing margin 60x is set to be crushed against the back surface 31a of the printed circuit board 31 when the back surface 31a of the printed circuit board 31 abuts on the support surface S of the first casing member 41.

That is, the side wall portion 44 of the first casing member 41, on which the engagement protrusions 60 are provided, is located outside the printed circuit board 31 in the planar direction (the right side in FIG. 12) in a state where the back surface 31a of the printed circuit board 31 abuts on the support surface S formed by the top portion 55a of the annular protrusion 55 (see FIGS. 5 and 11). Therefore, when the back surface 31a of the printed circuit board 31 abuts on the support surface S of the first casing member 41, the back surface 31a of the printed circuit board 31 moving in the thickness direction may crush the crushing margin 60x of each of the engagement protrusions 60 provided on the side wall portion 44 located outside the printed circuit board 31 in the planar direction so that a backlash of the printed circuit board 31 in the planar direction may be eliminated. Accordingly, as illustrated in FIG. 11, the accommodation casing 30 of the embodiment is capable of stably holding the printed circuit board 31 disposed within the accommodation chamber 35.

As illustrated in FIGS. 11 and 12, in the accommodation casing 30 of the embodiment, in each of the pressing portions 57 provided in the second casing member 42, a crushing margin 57x is also set on a distal end portion of the pressing portion 57 which abuts on the front surface 31b of the printed circuit board 31. In the embodiment, the crushing margin 57x of the pressing portion 57 is formed in a thin-plate shape that intersects with the planar direction of the printed circuit board 31 assembled to the first casing member 41. Accordingly, in the accommodation casing 30 of the embodiment, a backlash of the printed circuit board 31 in the thickness direction (the up-down direction in FIG. 12) is eliminated while the printed circuit board 31 is more reliably sandwiched between the pressing portions 57 and the support surface S of the first casing member 41.

More specifically, as illustrated in FIGS. 7 and 9, in the annular protrusion 55 of the embodiment, plural cut-out portions 61 are formed in such a manner that each of the cut-out portions 61 cuts out a part of the support surface S formed by the top portion 55a. Specifically, the annular protrusion 55 of the embodiment has two cut-out portions 61 at a circumferential position facing each of side wall portions 44a to 44d (44) surrounding four sides of the bottom surface 41s of the first casing member 41. In addition, the first casing member 41 of the embodiment includes the engagement protrusions 60 formed on each side wall portion 44, at the circumferential position of the annular protrusion 55 in which the cut-out portions 61 are formed, in a state where two engagement protrusions 60 are aligned.

Figure 13A:
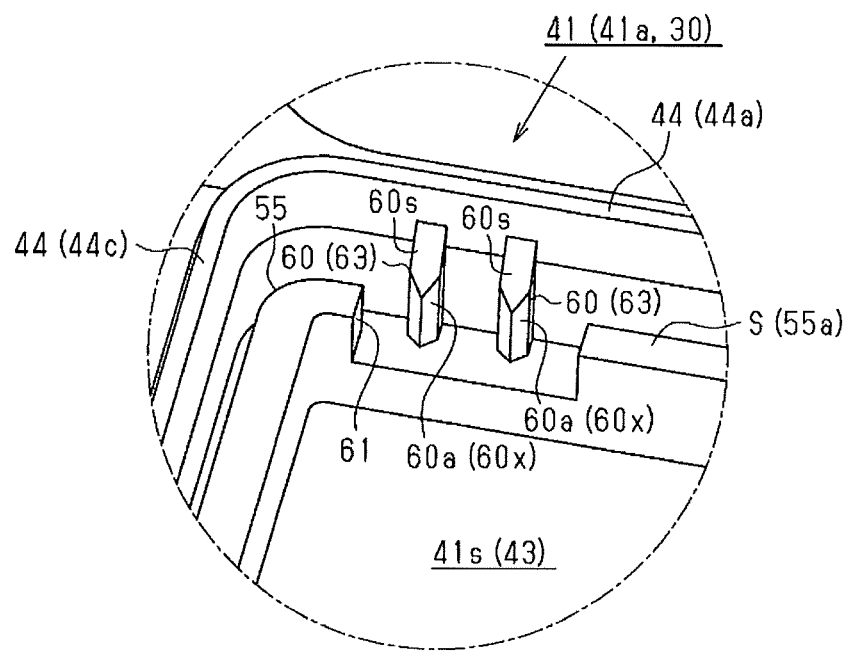
FIGS. 13A and 13B are perspective views of a support surface for the printed circuit board and the engagement protrusion provided in the first casing member.
Figure 13B:
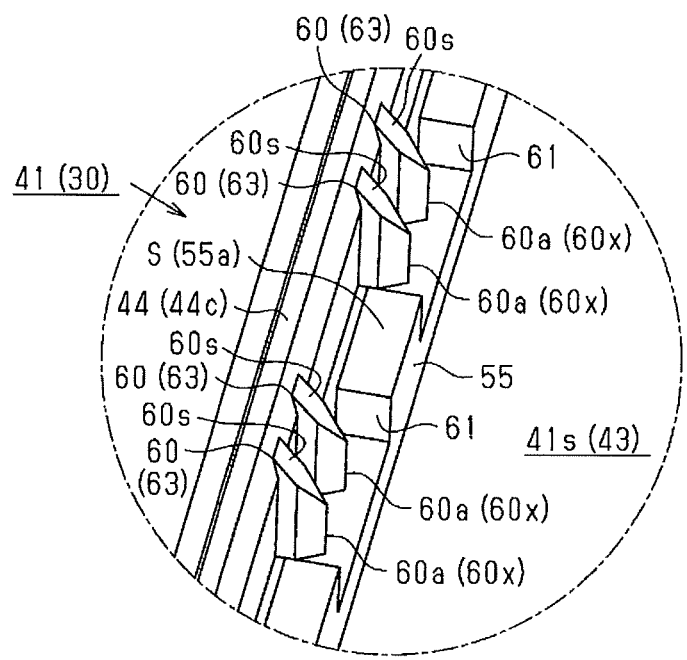

As illustrated in FIGS. 13A and 13B and FIGS. 14A to 14C, each of the engagement protrusions 60 of the embodiment has a projection shape extending in a direction substantially perpendicular to the bottom surface 41s of the first casing member 41 (the direction perpendicular to the paper surface in FIGS. 14A to 14C), that is, in a direction in which the printed circuit board 31 is inserted into the first casing member 41. As illustrated in FIG. 12 and FIGS. 13A and 13B, each of the engagement protrusions 60 has a slope 60s at an end portion at the opening side of the first casing member 41, in which, at a position spaced apart from the side wall portion 44, the slope 60s is closer to the bottom surface 41s side, that is, the support surface S for the printed circuit board 31 in the thickness direction of the printed circuit board 31. Further, as illustrated in FIG. 12 to FIGS. 14A to 14C, in each of the engagement protrusions 60, a distal end portion 60a, which protrudes in a direction substantially perpendicular to the side wall portion 44, that is, in the planar direction of the printed circuit board 31 in a state where the back surface 31a of the printed circuit board 31 abuts on the support surface S of the first casing member 41, is formed in a substantially triangular prismatic shape. In addition, in the accommodation casing 30 of the embodiment, the crushing margin 60x of each of the engagement protrusions 60 is set on the distal end portion 60a of the engagement protrusion 60.

Figure 14A:
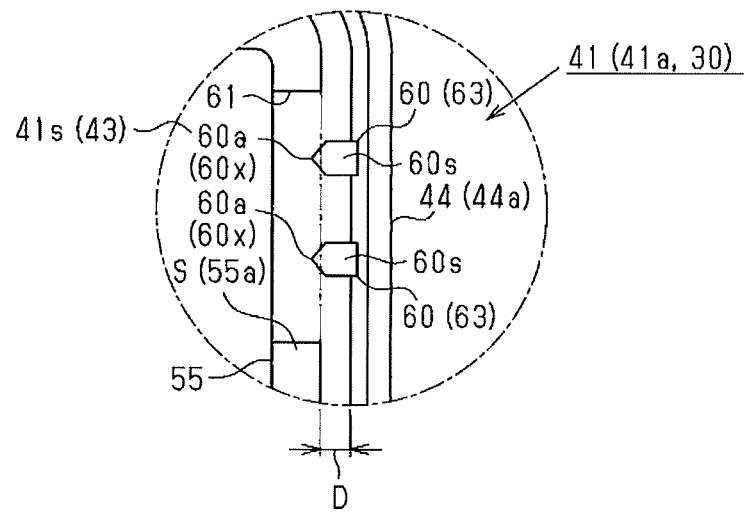
FIGS. 14A to 14C are plan views of the support surface for the printed circuit board and the engagement protrusion provided in the first casing member.
Figure 14B:
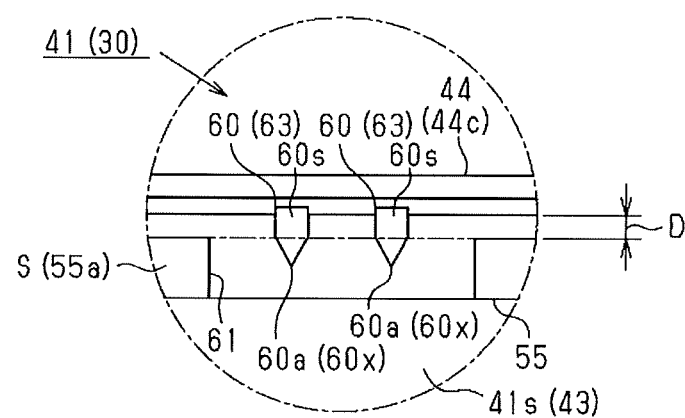
Figure 14C:
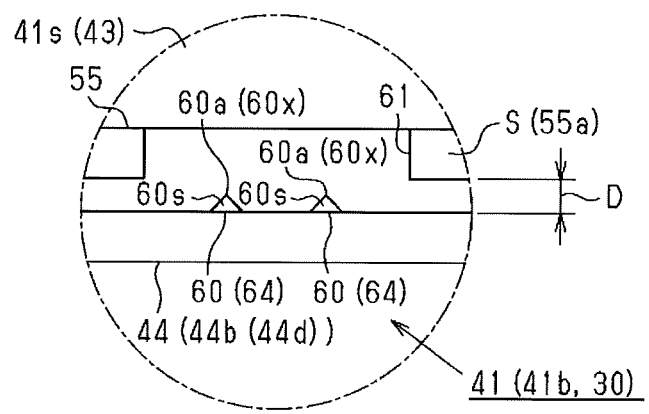

As illustrated in FIGS. 13A and 14A, in the first casing member 41 of the embodiment, in each of the engagement protrusions 60 (63) formed on the side wall portion 44a at the side of the side end portion 41a on which the hinge portion 48 is provided, the distal end portion 60a formed in a triangular prismatic shape tapering in the protruding direction is disposed inside the cut-out portion 61 formed in the annular protrusion 55. As illustrated in FIGS. 13B and 14B, in each of the engagement protrusions 60 (63) formed on the side wall portion 44c that crosses and extends from the side wall portion 44a as well, the distal end portion 60a formed in a triangular prismatic shape is disposed inside the cut-out portion 61 formed in the annular protrusion 55. Further, as illustrated in FIG. 14C, each of the engagement protrusions 60 (64) formed on the side wall portions 44b and 44d which respectively face the two side wall portions 44a and 44c, is formed in a triangular prismatic shape as a whole. In addition, in each of the engagement protrusions 64, the distal end portion 60a extending toward the cut-out portion 61 formed in the annular protrusion 55 does not reach the cut-out portion 61, and thus is disposed within the gap D between the annular protrusion 55 and the side wall portion 44.

Figure 15:
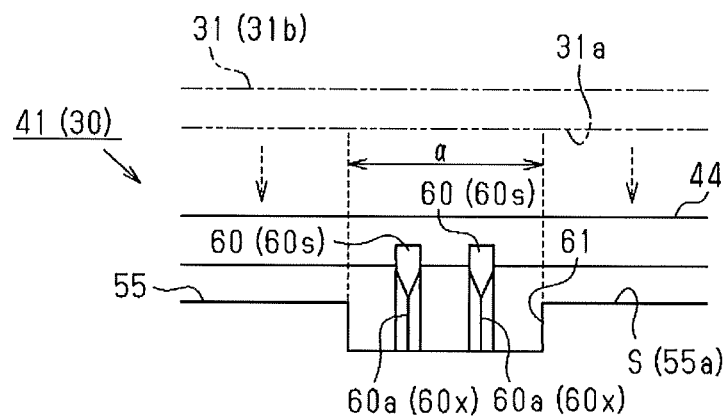
FIG. 15 is a front view of the engagement protrusion.

That is, as illustrated in FIG. 15, in the accommodation casing 30 of the embodiment, the distal end portion 60a of each of the engagement protrusions 60 is disposed at a location (a non-supporting surface abutment location α) where the support surface S for the printed circuit board 31, which is formed on the first casing member 41, does not abut on the back surface 31a of the printed circuit board 31. Accordingly, in the accommodation casing 30 of the embodiment, the crushing margin 60x set on the distal end portion 60a of each engagement protrusion 60 is crushed against the back surface 31a of the printed circuit board 31 at the non-supporting surface abutment location α.

Thereafter, descriptions will be made on the action of the accommodation casing 30 of the embodiment, which is configured as described above.

Figure 16:
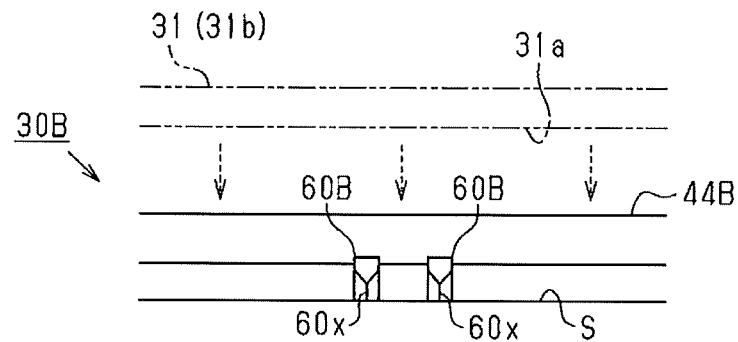
FIG. 16 is a front view of an engagement protrusion in a reference example.
Figure 17:
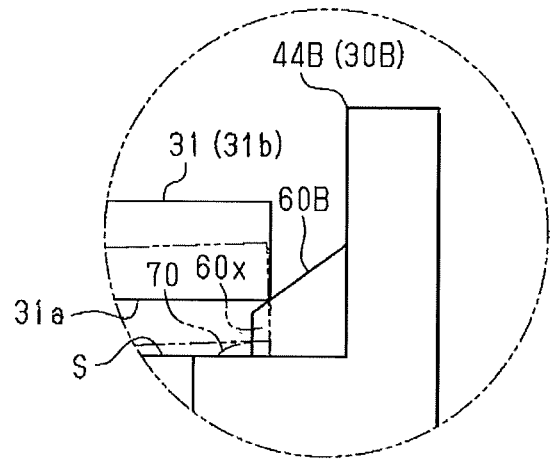
FIG. 17 is an explanatory view of an action of the engagement protrusion in the reference example.

For example, as in an accommodation casing 30B in the comparative example illustrated in FIGS. 16 and 17, in a configuration where an engagement protrusion 60B formed on a side wall portion 44B is located on the support surface S for the printed circuit board 31, shavings 70 generated when the crushing margin 60x set on the engagement protrusion 60B is crushed are trapped between the support surface S and the back surface 31a of the printed circuit board 31. Accordingly, there is a possibility that a stress to deflect the printed circuit board 31 is generated.

However, as illustrated in FIGS. 12 to 15, in the case of the accommodation casing 30 of the embodiment, at a location where the back surface 31a of the printed circuit board 31 crushes the crushing margin 60x of the engagement protrusion 60, there is no support surface S for the printed circuit board 31. Accordingly, the shavings 70 of the engagement protrusion 60 may be released into the gap formed around the engagement protrusion 60 so as to suppress the occurrence of the stress that deflects the printed circuit board 31.

The printed circuit board 31 assembled to the first casing member 41 is pushed against the support surface S formed on the first casing member 41 when each pressing portion 57 of the second casing member 42 rotating around the hinge portion 48 as a fulcrum abuts on the front surface 31b. Furthermore, here, a force acts on the printed circuit board 31 while pressing the printed circuit board 31 from the first side end portion 30a side provided with the hinge portion 48 toward the opposite side, that is, the second side end portion 30b side. Accordingly, the printed circuit board 31 may ride on each engagement protrusion 60 formed on the side wall portion 44b at the second side end portion 30b side, and thus the printed circuit board 31 may be deflected.

In this regard, in the accommodation casing 30 of the embodiment, as described above, each engagement protrusion 60 (64) formed on the side wall portion 44b located at the second side end portion 30b opposite to the first side end portion 30a provided with the hinge portion 48 is formed in a triangular prismatic shape as a whole. Accordingly, in the accommodation casing 30 of the embodiment, the crushing margin 60x is set on the whole of each engagement protrusion 64 so that the printed circuit board 31 does not ride on each engagement protrusion 64.

According to the embodiment described above, the following effects may be obtained.

(1) The accommodation casing 30 includes: the support surface S abutting on the back surface 31 of the printed circuit board 31; the side wall portion 44 located outside the printed circuit board 31 in the planar direction in a state where the back surface 31a as a first planar portion abuts on the support surface S; and the engagement protrusion 60 formed on the side wall portion 44. In addition, the crushing margin 60x is set on the engagement protrusion 60, which is crushed against the back surface 31a of the printed circuit board 31, at a location (a non-supporting surface abutment location α) where the support surface S does not abut on the back surface 31a of the printed circuit board 31.

That is, when the back surface 31a of the printed circuit board 31 abuts on the support surface S, the back surface 31a of the printed circuit board 31 moving in the thickness direction may crush the crushing margin 60x of the engagement protrusion 60 formed on the side wall portion 44 located outside the printed circuit board 31 in the planar direction so that a backlash of the printed circuit board 31 in the planar direction may be eliminated. Thus, the printed circuit board 31 may be stably held.

According to the above described configuration, at a location where the back surface 31a of the printed circuit board 31 crushes the crushing margin 60x of the engagement protrusion 60, there is no support surface S for the printed circuit board 31. Therefore, the shavings 70 generated when the back surface 31a of the printed circuit board 31 crushes the crushing margin 60x set on the engagement protrusion 60 may be released into the gap formed around the engagement protrusion 60. Thus, it is possible to suppress the occurrence of a stress that deflects the printed circuit board 31. As a result, the printed circuit board 31 may be more stably held.

(2) The accommodation casing 30 includes the annular protrusion 55 serving as a support protrusion that has the top portion 55a on which the support surface S for the printed circuit board 31 is formed. In the annular protrusion 55, the cut-out portion 61 is formed in such a manner that the cut-out portion 61 cuts out a part of the support surface S formed by the top portion 55a. Further, the engagement protrusion 60 is formed on the side wall portion 44 located outside the printed circuit board 31 in the planar direction, at the circumferential position of the annular protrusion 55 in which the cut-out portion 61 is formed. In addition, in the engagement protrusion 60, the distal end portion 60a protruding from the side wall portion 44 in the planar direction of the printed circuit board 31 extends toward the annular protrusion 55 and the cut-out portion 61.

That is, when the top portion 55a of the annular protrusion 55 serves as the support surface S, the printed circuit board 31 may be stably held. In addition, when the engagement protrusion 60 is configured as described above, the crushing margin 60x crushed against the back surface 31a of the printed circuit board 31 may be set on the distal end portion 60a of the engagement protrusion 60 at a location where the support surface S does not abut on the back surface 31a of the printed circuit board 31.

(3) The accommodation casing 30 includes the engagement protrusion 60 (63) which has the distal end portion 60a disposed inside the cut-out portion 61 formed in the annular protrusion 55.

According to this configuration, the crushing margin 60x set on the distal end portion 60a of the engagement protrusion 63 may be more reliably crushed at a location where the support surface S does not abut on the back surface 31a of the printed circuit board 31. Accordingly, the printed circuit board 31 may be more stably held.

(4) The accommodation casing 30 includes the first and second casing members 41 and 42 which form the accommodation chamber 35 for the printed circuit board 31 by being assembled to each other. The first casing member includes the annular protrusion 55 that forms the support surface S for the printed circuit board 31, and the side wall portion 44 formed with the engagement protrusion 60. In addition, in the second casing member 42, the pressing portion 57 is formed, which abuts on the front surface 31b becoming a second planar portion of the printed circuit board 31, thereby pushing the printed circuit board 31 against the support surface S of the first casing member 41.

According to this configuration, when the first and second casing members 41 and 42 are assembled to each other, the printed circuit board 31 may be stably held in a state where the printed circuit board 31 is sandwiched between the first and second casing members 41 and 42. Here, further, the crushing margin 60x of the engagement protrusion 63 formed on the side wall portion 44 is crushed against the back surface 31a of the printed circuit board 31. Accordingly, a backlash of the printed circuit board 31 in the planar direction may be more easily eliminated.

(5) The accommodation casing 30 includes the hinge portion 48 that connects the first and second casing members 41 and 42 to each other with bendable-flexibility.

According to this configuration, since the first and second casing members 41 and 42 are relatively rotated about the hinge portion 48 as a fulcrum, the first and second casing members 41 and 42 may be easily assembled to each other. In addition, since the crushing margin 60x of the engagement protrusion 63 formed on the side wall portion 44 is crushed against the back surface 31a of the printed circuit board 31, a backlash of the printed circuit board 31 in the planar direction may be easily eliminated.

(6) The crushing margin 60x is set on the whole of the engagement protrusion 60 (64) formed on the side wall portion 44 located at the second side end portion 30b opposite to the first side end portion 30a provided with the hinge portion 48.

According to this configuration, when the printed circuit board 31 is sandwiched between the first and second casing members 41 and 42, the printed circuit board 31 that is pressed from the first side end portion 30a provided with the hinge portion 48 toward the opposite side, that is, the second side end portion 30b side, does not ride on the engagement protrusion 64 formed on the side wall portion 44 located at the second side end portion 30b side. Accordingly, the printed circuit board 31 may be more stably held.

(7) The accommodation casing 30 includes the snap fit 50 that fixes the first and second casing members 41 and 42 on the second side end portion 30b opposite to the first side end portion 30a provided with the hinge portion 48.

According to this configuration, since the first and second casing members 41 and 42 are relatively rotated about the hinge portion 48 as a fulcrum, the first and second casing members 41 and 42 may be easily fixed. Accordingly, the printed circuit board 31 may be stably held in a state where the printed circuit board 31 is sandwiched between the first and second casing members 41 and 42.

(8) The gap D is formed between the annular protrusion 55 and the side wall portion 44. When this configuration is employed, the shavings 70 generated when the back surface 31a of the printed circuit board 31 crushes the crushing margin 60x of the engagement protrusion 60 formed on the side wall portion 44 may be released into the gap D.

(9) The engagement protrusion 60 has a projection shape extending in the thickness direction of the printed circuit board 31. Accordingly, it is possible to set the crushing margin 60x that is easily crushed by the back surface 31a of the printed circuit board 31 moving in the thickness direction when the back surface 31a of the printed circuit board 31 abuts on the support surface S.

(10) The distal end portion 60a of the engagement protrusion 60 is formed in a triangular prismatic shape tapering in the protruding direction of the engagement protrusion 60 that protrudes in a direction substantially perpendicular to the side wall portion 44. Accordingly, the crushing margin 60x that is easily crushed may be set on the distal end portion 60a of the engagement protrusion 60.

(11) The engagement protrusion 60 is formed with the slope 60s, which is closer to the support surface S at a position spaced apart from the side wall portion 44. Accordingly, it is possible to easily crush the crushing margin 60x set on the distal end portion 60a of the engagement protrusion 60 protruding from the side wall portion 44.

(12) In the accommodation casing 30, the first and second casing members 41 and 42, and the hinge portion 48 are integrally made of a resin. Accordingly, it is possible to stably hold the printed circuit board 31 such that the printed circuit board 31 is sandwiched between the first and second casing members 41 and 42, through an easy and simple configuration.

The above embodiment may be modified as follows.

In the above embodiment, the accommodation casing 30 is implemented as an accommodation case 30 of a printed circuit board 31, which constitutes a control device 20 of an actuator 11 provided in a steering apparatus 1 is embodied. However, the accommodation casing 30 may be implemented as an accommodation case of a printed circuit board 31 used for other purposes.

In the above embodiment, the first and second casing members 41 and 42, and the hinge portion 48 are integrally made of a resin in the accommodation casing 30. However, the material may be arbitrarily changed. The first and second casing members 41 and 42 may be separately formed. Further, the structure of the snap fit 50 may be arbitrarily changed. Also, a configuration with no snap fit 50 may be employed.

In the above embodiment, the printed circuit board 31 is sandwiched between the first and second casing members 41 and 42. However, without being limited thereto, a structure of fixing the printed circuit board 31 in the thickness direction may be arbitrarily changed. For example, a screw member may be used.

In the above embodiment, a gap D is formed between the annular protrusion 55 and the side wall portion 44. However, the annular protrusion 55 may be adjacent to the side wall portion 44. The annular protrusion 55 may not be necessarily formed in a rectangular annular shape. In addition, the shape of the support protrusion forming the support surface S may not be necessarily annular.

The number or arrangement of engagement protrusions 60 may be arbitrarily changed. The shape of the engagement protrusions 60 may also be arbitrarily changed as long as a crushing margin 60x may be set, which is crushed against the back surface 31a of the printed circuit board 31, at a location where the support surface S does not abut on the back surface 31a of the printed circuit board 31.

Further, the shapes of the first and second casing members 41 and 42 may also be arbitrarily changed. In addition, the arrangement of the side wall portion 44 located outside the printed circuit board 31 in the planar direction may also be arbitrarily changed.

In the above embodiment, the back surface 31a of the printed circuit board 31 is set as a first planar portion, but the front surface 31b may become the first planar portion.

It is preferable that a printed circuit board accommodation casing according to an aspect of this disclosure includes: a support surface that abuts on a first planar portion of a printed circuit board; a side wall portion located outside in a planar direction of the printed circuit board the first planar portion of which is abutted by the support surface; and an engagement protrusion formed on the side wall portion, in which a crushing margin, which is crushed against the first planar portion of the printed circuit board, is set on the engagement protrusion at a location where the support surface does not abut on the first planar portion of the printed circuit board.

That is, when the first planar portion of the printed circuit board abuts on the support surface, the first planar portion of the printed circuit board moving in the thickness direction may crush the crushing margin of the engagement protrusion formed on the side wall portion located outside the printed circuit board in the planar direction so that a backlash of the printed circuit board in the planar direction may be eliminated. Accordingly, the printed circuit board may be stably held.

According to this configuration, at a location where the first planar portion of the printed circuit board crushes the crushing margin of the engagement protrusion, there is no support surface for the printed circuit board. Therefore, the shavings generated when the crushing margin of the engagement protrusion is crushed may be released into the gap formed around the engagement protrusion. Thus, it is possible to suppress the occurrence of a stress that deflects the printed circuit board. As a result, the printed circuit board may be more stably held.

It is preferable that the printed circuit board accommodation casing further includes a support protrusion having the support surface on a top portion thereof, a cut-out portion, which cuts out a part of the support surface, is formed in the support protrusion, and a distal end portion of the engagement protrusion protruding from the side wall portion in the planar direction of the printed circuit board extends toward the cut-out portion.

According to this configuration, the crushing margin crushed against the first planar portion of the printed circuit board may be set on the distal end portion of the engagement protrusion at a location where the support surface does not abut on the first planar portion of the printed circuit board.

In the printed circuit board accommodation casing, it is preferable that the distal end portion of the engagement protrusion is disposed inside the cut-out portion.

According to this configuration, the crushing margin set on the distal end portion of the engagement protrusion may be more reliably crushed, at a location where the support surface does not abut on the first planar portion of the printed circuit board. Accordingly, the printed circuit board may be more stably held.

In the printed circuit board accommodation casing, it is preferable that the support protrusion is an annular protrusion extending along the side wall portion, and the engagement protrusion is formed on the side wall portion at a circumferential position of the annular protrusion in which the cut-out portion is formed.

That is, when the top portion of the annular protrusion serves as the support surface, the printed circuit board may be stably held. In addition, according to this configuration, the crushing margin crushed against the first planar portion of the printed circuit board may be set on the distal end portion of the engagement protrusion formed on the side wall portion at a location where the support surface does not abut on the first planar portion of the printed circuit board.

It is preferable that the printed circuit board accommodation casing further includes: a first casing member including the support surface, the side wall portion and the engagement protrusion; and a second casing member including a pressing portion that abuts on a second planar portion of the printed circuit board such that the printed circuit board is sandwiched between the first casing member and the second casing member.

According to this configuration, when the first and second casing members are assembled to each other, the printed circuit board may be stably held in a state where the printed circuit board is sandwiched between the first and second casing members. In addition, the crushing margin of the engagement protrusion formed on the side wall portion is crushed against the first planar portion of the printed circuit board. Accordingly, a backlash of the printed circuit board in the planar direction may be more easily eliminated.

It is preferable that the printed circuit board accommodation casing further includes a hinge portion that has bendable-flexibility and connects the first and second casing members to each other.

According to this configuration, since the first and second casing members are relatively rotated about the hinge portion as a fulcrum, the first and second casing members may be easily assembled to each other. In addition, since the crushing margin of the engagement protrusion formed on the side wall portion is crushed against the first planar portion of the printed circuit board, a backlash of the printed circuit board in the planar direction may be easily eliminated.

It is preferable that the printed circuit board accommodation casing, includes the engagement protrusion formed on the side wall portion located at a second side end portion side opposite to a first side end portion on which the hinge portion is provided, and the crushing margin is set on a whole of the engagement protrusion formed on the side wall portion located at the second side end portion side.

According to this configuration, when the printed circuit board is sandwiched between the first and second casing members, the printed circuit board pressed from the first side end portion provided with the hinge portion toward the opposite side (i.e., the second side end portion side), may not be caused to ride on the engagement protrusion formed on the side wall portion located at the second side end portion side. Accordingly, the printed circuit board may be more stably held.

It is preferable that the accommodation casing of the printed circuit board further includes a snap fit that fixes the first and second casing members at the second side end portion opposite to the first side end portion on which the hinge portion is provided.

According to this configuration, since the first and second casing members are relatively rotated about the hinge portion as a fulcrum, the first and second casing members may be easily fixed. Accordingly, the printed circuit board may be stably held in a state where the printed circuit board is sandwiched between the first and second casing members.

According to the aspect of this disclosure, the printed circuit board may be more stably held.

Hereinafter, technical ideas that may be grasped from the above embodiment will be described together with the effects.

(A) The printed circuit board accommodation casing, in which a gap is formed between the support protrusion and the side wall portion. When this configuration is employed, shavings generated when the first planar portion of the printed circuit board crushes the crushing margin of the engagement protrusion formed on the side wall portion may be released into the gap.

(B) The printed circuit board accommodation casing, in which the engagement protrusion has a projection shape extending in the thickness direction of the printed circuit board. Accordingly, it is possible to set the crushing margin that is easily crushed by the back surface of the printed circuit board moving in the thickness direction when the back surface of the printed circuit board abuts on the support surface.

(C) The printed circuit board accommodation casing, in which the distal end portion of the engagement protrusion is formed in a triangular prismatic shape. Accordingly, the crushing margin that is easily crushed may be set on the distal end portion of the engagement protrusion.

(D) The printed circuit board accommodation casing, in which in the engagement protrusion, the slope is formed, which approaches the support surface by a position spaced apart from the side wall portion. Accordingly, it is possible to easily crush the crushing margin set on the distal end portion of the engagement protrusion protruding from the side wall portion.

(E) The printed circuit board accommodation casing, in which the first and second casing members, and the hinge portion are integrally made of a resin. Accordingly, it is possible to stably hold the printed circuit board such that the printed circuit board is sandwiched between the first and second casing members, through an easy and simple configuration.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A printed circuit board accommodation casing comprising:
    a support surface that abuts on a first planar portion of a printed circuit board;
    a side wall portion at least partially surrounding the first planar portion of the printed circuit board, the first planar portion of which is abutted by the support surface; and
    an engagement protrusion formed on the side wall portion,
    wherein the engagement protrusion includes a crushing margin, which is crushed against the first planar portion of the printed circuit board such that the crushing margin is changed in shape by direct pressing contact with the printed circuit board, at a location where the support surface does not abut on the first planar portion of the printed circuit board.

2. The printed circuit board accommodation casing according to claim 1, further comprising:
    a support protrusion having the support surface on a top portion thereof;
    wherein a cut-out portion, which cuts out a part of the support surface, is formed in the support protrusion, and
    a distal end portion of the engagement protrusion protruding from the side wall portion in the planar direction of the printed circuit board extends toward the cut-out portion.

3. The printed circuit board accommodation casing according to claim 2,
    wherein the distal end portion of the engagement protrusion is disposed inside the cut-out portion.

4. The printed circuit board accommodation casing according to claim 2,
    wherein the support protrusion is an annular protrusion extending along the side wall portion, and
    the engagement protrusion is formed on the side wall portion at a circumferential position of the annular protrusion in which the cut-out portion is formed.

5. The printed circuit board accommodation casing according to claim 3,
    wherein the support protrusion is an annular protrusion extending along the side wall portion, and
    the engagement protrusion is formed on the side wall portion at a circumferential position of the annular protrusion in which the cut-out portion is formed.

6. The printed circuit board accommodation casing according to claim 1, further comprising:
    a first casing member including the support surface, the side wall portion, and the engagement protrusion; and
    a second casing member including a pressing portion that abuts on a second planar portion of the printed circuit board such that the printed circuit board is sandwiched between the first casing member and the second casing member.

7. The printed circuit board accommodation casing according to claim 2, further comprising:
    a first casing member including the support surface, the side wall portion, and the engagement protrusion; and
    a second casing member including a pressing portion that abuts on a second planar portion of the printed circuit board such that the printed circuit board is sandwiched between the first casing member and the second casing member.

8. The printed circuit board accommodation casing according to claim 3, further comprising:

a first casing member including the support surface, the side wall portion, and the engagement protrusion; and a second casing member including a pressing portion that abuts on a second planar portion of the printed circuit board such that the printed circuit board is sandwiched between the first casing member and the second casing member.

9. The printed circuit board accommodation casing according to claim 4, further comprising:

a first casing member including the support surface, the side wall portion, and the engagement protrusion; and a second casing member including a pressing portion that abuts on a second planar portion of the printed circuit board such that the printed circuit board is sandwiched between the first casing member and the second casing member.

10. The printed circuit board accommodation casing according to claim 6, further comprising:

a hinge portion that has bendable-flexibility and connects the first and second casing members to each other.

11. The printed circuit board accommodation casing according to claim 10, wherein the printed circuit board accommodation casing includes the engagement protrusion formed on the side wall portion located at a second side end portion side opposite to a first side end portion on which the hinge portion is provided, and the crushing margin is set on a whole of the engagement protrusion formed on the side wall portion located at the second side end portion side.

12. The printed circuit board accommodation casing according to claim 10, further comprising:

a snap fit that fixes the first and second casing members at the second side end portion opposite to the first side end portion on which the hinge portion is provided.

13. The printed circuit board accommodation casing according to claim 11, further comprising:

a snap fit that fixes the first and second casing members at the second side end portion opposite to the first side end portion on which the hinge portion is provided.

* * * * *